United States Patent [19]
Foroudi

[11] Patent Number: 6,097,782
[45] Date of Patent: Aug. 1, 2000

[54] MULTI-MODULUS FREQUENCY DIVIDER

[75] Inventor: Navid Foroudi, Ottawa, Canada

[73] Assignee: Nortel Networks Corporation, Montreal, Canada

[21] Appl. No.: 09/118,368

[22] Filed: Jul. 17, 1998

[51] Int. Cl.[7] .................................................. H03K 21/00
[52] U.S. Cl. ................................ 377/47; 377/39; 377/44
[58] Field of Search .................................. 377/47, 39, 44

[56] References Cited

U.S. PATENT DOCUMENTS

| | | | |
|---|---|---|---|
| 4,472,820 | 9/1984 | Borras | 377/52 |
| 5,337,339 | 8/1994 | Hillstrom | 377/52 |

*Primary Examiner*—Margaret R. Wambach
*Attorney, Agent, or Firm*—Angela C. de Wilton

[57] ABSTRACT

A multi-ratio frequency divider, which is implemented in a BiCMOS (bipolar-complementary metal oxide semiconductor) circuit, includes a dual-modulus counter for dividing by P+1 and P. P+1 is a power of two and there is not necessary an additional flip-flop responsive to high input frequency, which consumes power due to bipolar transistor devices. An output from the counter is further divided by a variably set value. When its count reaches another set value, the division ratio of the dual-modulus counter is switched to another division ratio. When the further divided counter reaches the variably set value, a new cycle starts. The total division ratio of the multi-modulus frequency divider is a combination of the variably set division values, both being binary bit data. No decoder is necessary for converting an input division ratio to the set values.

20 Claims, 4 Drawing Sheets

MULTI-MODULUS FREQUENCY DIVIDER

TECHNICAL FIELD

The present invention relates to a multi-modulus frequency divider.

BACKGROUND INFORMATION

Giga Hertz range frequency synthesizers using a phase-locked loop (PLL) need high-speed multi-modulus frequency dividers which divide input frequency by a selected one of a plurality of division ratios. In a known high-speed multi-modulus frequency divider, an input division ratio N is applied to a decoder having a look-up table which provides appropriate values M and K, so that values M and K are programmably set to the M and K programmable counters, respectively. A dual-modulus counter (DMC) divides input frequency fin and its output of a divided frequency is provided to the K and M counters. The DMC selects its division ratio P or P+1 in response to the count of the K counter. Value K is any value between 0 to P-1. If value K is greater than zero, the division ratio of the DMC is set to P+1 at the start of the cycle. The divided output of the DMC clocks the two counters. When the count of the K counter reaches its programmed value K, it ceases counting and the division ratio of the DMC is set to P. When the count of the M counter reaches its programmed value M, the M and K counters are reset and the cycle repeats. A divided frequency fout is provided by the M counter. A total division ratio Rdiv of the frequency divider is given by:

$$Rdiv = fin/fout = K(P+1) + (M-K)P$$

or $$Rdiv = fin/fout = MP + K \quad (1)$$

A drawback is that it requires the decoder which needs a great number of input bits, resulting in a complicated circuit. For example, the frequency divider needs a large number of bits to divide numbers as high as 262,143. Specifically, the decoder needs 18 input bits. One solution is to choose P equal to a power of two ($P=2^k$). The total division ratio Rdiv of the frequency divider is given by:

$$Rdiv = fin/fout = M(2^k) + K \quad (2)$$

Because the k least significant bits (LSBs) of the input division ratio word can be directly used as the program inputs to the K counter and the remaining bits of the input word can be directly used as the program input to the M counter, no decoder is required. The largest modulus of a counter with n flip-flops is $2^n$. In order to count to $2^{n+1}$, an additional flip-flop is necessary for the input stage of the counter, the additional flip-flop being clocked with a high input frequency. Because of high input frequency (e.g., GHz range), it requires high speed circuits of bipolar transistors, resulting in a large amount of power consumption. This is a drawback of the DMC having division ratios of P/P+1, P being a power of two ($P=2^k$).

SUMMARY OF THE INVENTION

It is an object of the present invention to provide an improved multi-modulus frequency divider.

According to one aspect of the present invention, there is provided a multi-modulus frequency divider comprising: a dual-modulus counter responsive to an input signal and for providing an output, the daul-modulus counter dividing the frequency of the input signal by either of division ratios P and P+1, P+1 being a power of two, the output having a divided frequency; binary counting means responsive to the output from the dual-modulus counter, the binary counting means providing binary data representing the counting status thereof; data comparison means for comparing binary data representing an input division ratio to the binary data representing the counting status of the binary counting means; and selection means for selecting the division ratio of the dual-modulus counter in response to the comparison result of the data comparison means.

In the multi-modulus frequency divider, the dual-modulus counter divides the input frequency by the selected division ratio P or P+1. The divided frequency is counted by the binary counting means and the binary data representing the counting status is provided to, the data comparison means. In response to the comparison result of the data comparison means, the division ratio of the dual-modulus counter is selected. The multi-modulus frequency divider requires no decoder having a look-up table. Also, because the division ratio P+1 of the dual-modulus counter is a power of two, no additional counting circuit (e.g., a flip-flop) is necessary for the high frequency input stage of the dual-modulus counter. Accordingly, the multi-modulus frequency divider consumes less power and its circuitry is less complicated.

For example, the binary counting means includes an m-bit binary counter. The data comparison means separates the binary data of the input division ratio into first binary data of m-bits representing a first value and second binary data of k-bits representing a second value. The complements of the second binary data are provided. The m-bit binary data representing the counting status is compared to the first binary data of m-bits representing the first value and the k LSBs of the m-bit binary data representing the counting status is compared to the complements of the second binary data.

For example, the dual-modulus counter is constructed with bipolar transistor devices and the binary counting means including m-bit binary counter is constructed with CMOS (complementary metal oxide semiconductor) devices. The bipolar transistor devices and the CMOS devices are implemented in a BiCMOS (bipolar-complementary metal oxide semiconductor) circuits. Because the division ratio P+1 of the daul-modulus counter is a power of two, no additional bipolar flip-flop consuming power is necessary for the high frequency input stage of the dual-modulus counter.

BRIEF DESCRIPTION OF THE DRAWINGS

Embodiments of the present invention will now be described by way of example with reference to the accompanying drawings in which.

DETAILED DESCRIPTION

Figure 1:
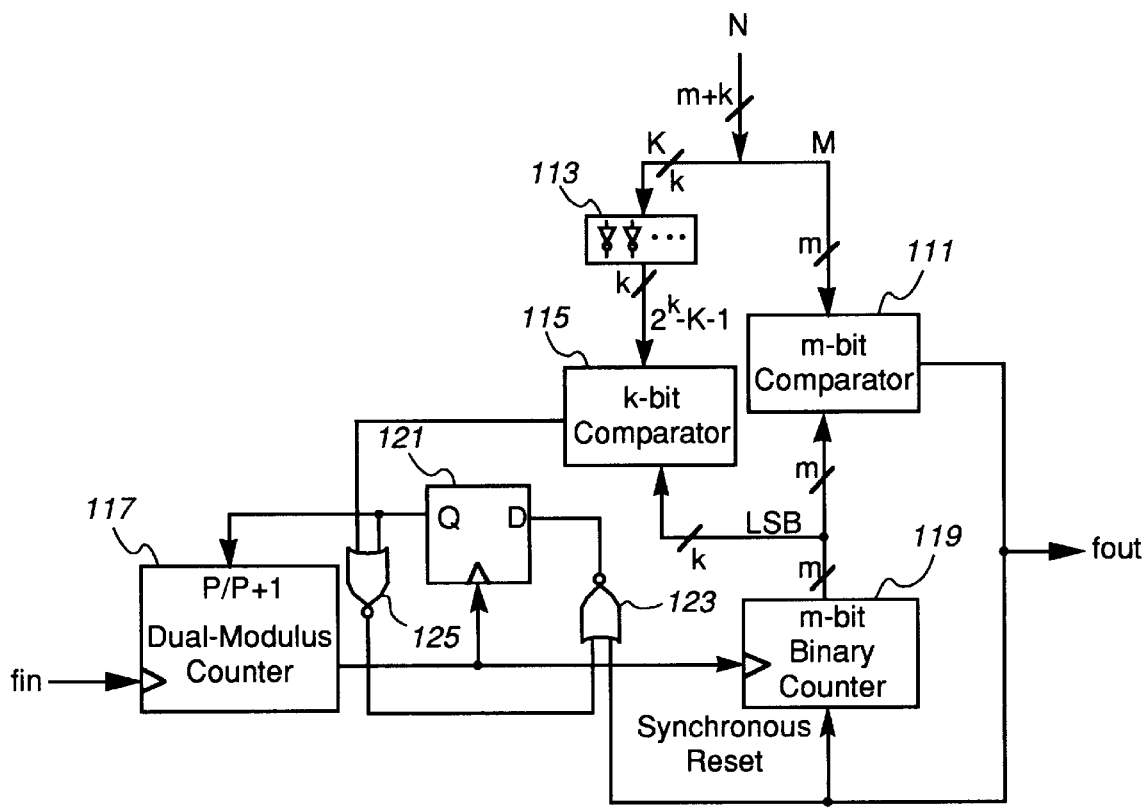
FIG. 1 is a block diagram of a multi-modulus frequency divider according to an embodiment of the present invention.

FIG. 1 shows a multi-modulus frequency divider according to an embodiment of the present invention. In FIG. 1, an input division ratio N is programmably given as binary data by an external circuit (not shown). The data of ratio N includes m-bit data of value M and k-bit data of value K. The m-bit data and k-bit data are separated and thereafter applied to an m-bit comparator 111 and inverters 113, respectively. All bits of the k-bits of value K are inverted by the inverters 113 to generate 1's complements of value K. The output data of the inverters 113 is k-bit data representing $2^k-K-1$ and is fed to an k-bit comparator 115.

An input signal of frequency fin clocks a dual-modulus counter (DMC) 117 which divides the frequency fin. The output of the counter 117 is fed to a m-bit binary counter 119 and a D-type flip-flop (D-FF) 121. The counter 119 provides m-bit output to the comparator 111 k LSBs (least significant bits) of the m-bits being fed to the comparator 115. The comparator 111 provides an m-bit comparison result as an output of frequency fout which is fed to the counter 119 and a NOfR gate 123. The comparator 115 provides an k-bit comparison result to a NOR gate 125, the output of which is fed to the NOR gate 123. The output of the NOR gate 123 is fed to D input of the D-FF 121, the Q output of which is fed to the NOR gate 125 and the counter 117. In response to the Q output of the D-FF 121, the counter 117 selects either of two division ratios P and P+1. P+1 is a power of two $(P+1=2^k)$.

Figure 2:
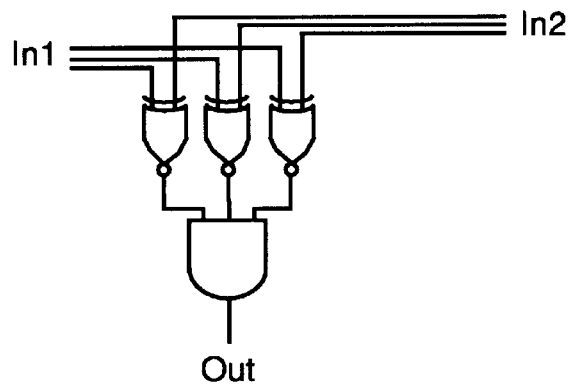
FIG. 2 is a block diagram of a 3-bit comparator used in the multi-modulus frequency divider shown in FIG. 1.

An example of the m-bit and k-bit comparators 111 and 115 is a 3-bit comparator shown in FIG. 2. It includes three exclusive NOR (XNOR) gates and an AND gate. Each data bit of one input $In_1$ is fed to the one input terminal of each XNOR gate and each data bit of the other input $In_2$ is fed to the other input terminal of each XNOR gate. The outputs of the three XNOR gates are fed to the AND gate, the "1" and "0" outputs of which represents the two inputs being identical and not.

When the m-bits of the output of the counter 119 match the m-bits of value M, the AND gate of the comparator 111 produces the "1" output. Similarly, when the k-bits of the output of the converter 113 match the k LSB bits of the counter 119 output, the AND gate of the k-bit comparator produces the "1" output.

The reset input of the counter 119 is synchronous. Therefore, when the counter 119 reaches M, it is reset on the next rising edge at the output of the counter 117. Since the counter 119 also counts 0 in the count sequence, it has a modulus of M+1. In other words, there are (M+1) DMC cycles in one divider cycle. The output of the comparator 111 is used as the output of the multi-modulus frequency divider.

Figure 3:
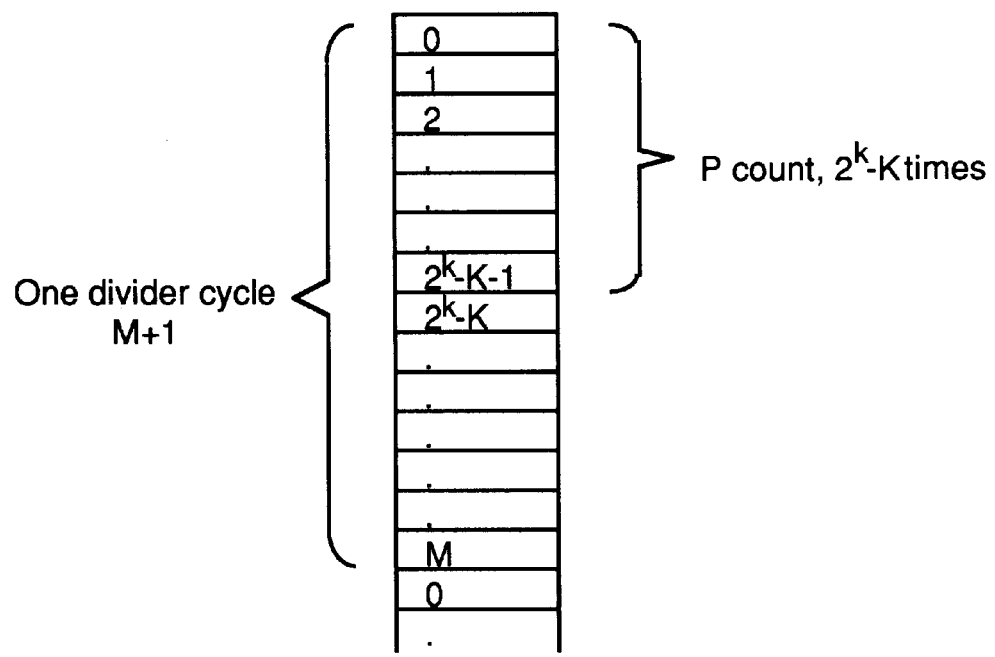
FIG. 3 illustrates binary counter states.

When the cycle starts and the counter 119 is in count 0, the counter 117 counts to P. When the k LSBs of the counter 119 output reach $2^k-K-1$, the D-FF 121 is set on the next rising edge of the counter 117 output. That sets the counter 117 to P+1. Thus, the number of times the counter 117 counts to P, in each cycle, is equal to $2^k-K$. This is demonstrated in FIG. 3.

For the rest of the time, during each cycle, the counter 117 is set to P+1. Value K may be any value in the inclusive range of 0 to $2^k-1$. In a case of K being 0, the counter 117 counts $2^k$ times to P in each cycle. In a case of K being $2^k-1$, the counter 117 counts only once to P in each cycle.

When the counter 119 reaches M, the counter 119 and the D-FF 121 are reset on the next rising edge at the output of the counter 117, and the cycle repeats. Therefore, the total division ratio Rdiv of the divider is given by:

$$Rdiv=fin/fout=(2^k-k)P+(M+1-2^k+K)(P+1)$$

$$=M(P+1)+K+P+1-2^k \quad (3)$$

Because P+1 is $2^k$, the division ratio Rdiv is simplified to:

$$Rdiv=fin/fout=M(P+1)+K \quad (4)$$

or $$Rdiv=fin/fout=M(2^k)+K \quad (5)$$

Therefore, the multi-modulus divider shown in FIG. 1 does not need a complicated look-up table and the K counter included in the known high-speed multi-modulus frequency divider is eliminated.

Typically, the multi-modulus frequency divider is implemented in a BiCMOM device. The counter 117 is constructed with bipolar transistor devices and the m-bit binary counter 119 is constructed with CMOS (complementary metal oxide semiconductor) devices. Because the division ratio P+1 of the DMC 117 is a power of two, no additional bipolar flip-flop consuming power is necessary for the high frequency input stage of the counter 117.

Figure 4:
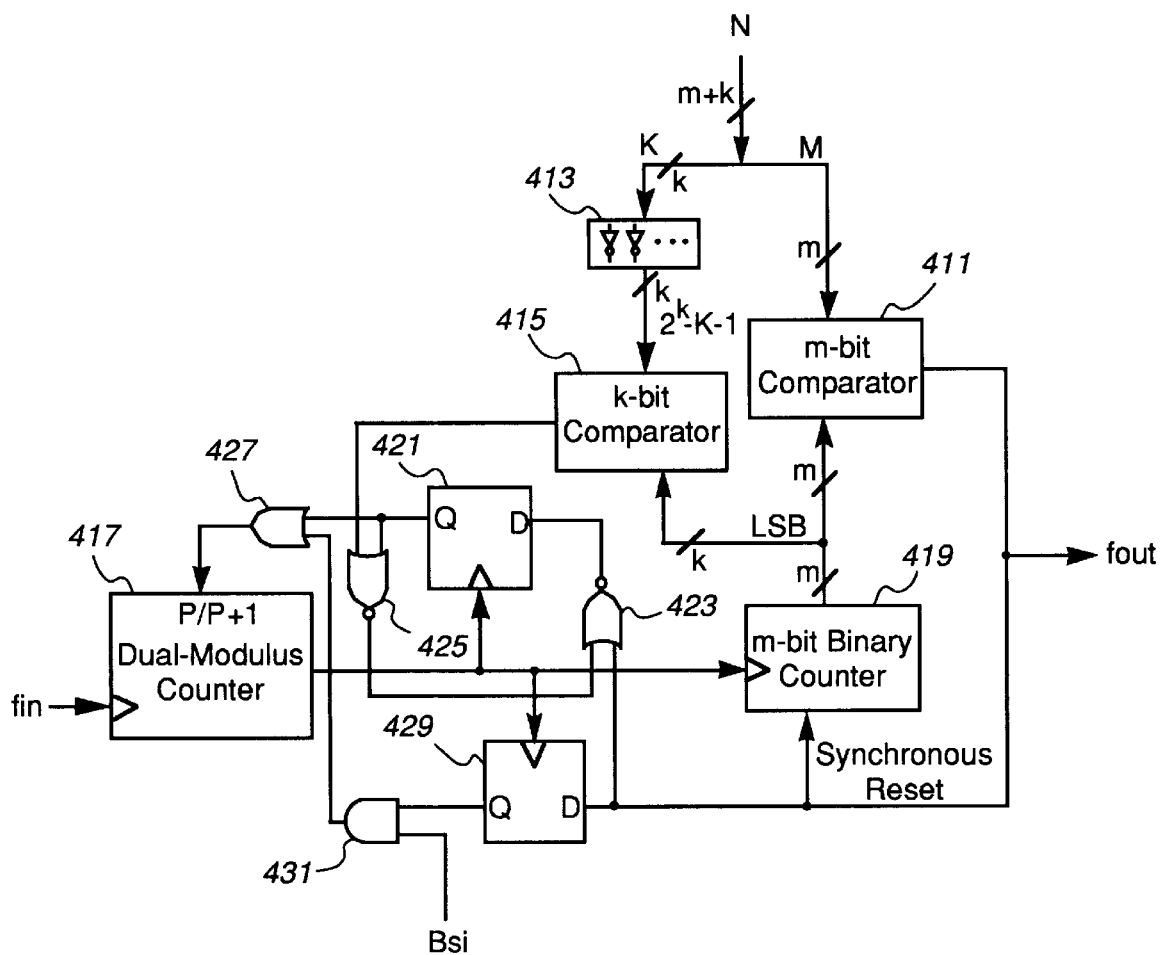
FIG. 4 is a block diagram of a multi-modulus frequency divider according to another embodiment of the present invention.

FIG. 4 is a block diagram of a multi-modulus frequency divider according to another embodiment of the present invention. In FIG. 4, a programmable division ratio N represents values M and K by m and k bits, respectively. The m and k bits of ratio N are applied to an m-bit comparator 411 and inverters 413, respectively. All bits of value K are inverted (1s complement) and k bits representing $2^k-K-1$ are fed to a k-bit comparator 415.

An input signal of frequency fin clocks a DMC 417 which divides the frequency. The output of the counter 417 is fed to a m-bit binary counter 419 and the clock input of a D-FF 421. The counter 419 provides m-bit output to the comparator 411, k LSBs of the m-bits being fed to the comparator 415. The comparator 411 provides an m-bit comparison result as an output of frequency fout which is fed to the counter 419 and a NOR gate 423. The comparator 415 provides a k-bit comparison result to a NOR gate 425, the output of which is fed to the NOR gate 423. The output of the NOR gate 423 is fed to the D input of the D-FF 421, the Q output of which is fed to the NOR gate 425 and an OR gate 427. The output of the OR gate 427 is fed to the counter 417. The output of the counter 417 is also fed to the clock input of a D-FF 429. The output of the comparator 411 is fed to the D input of the D-FF 429, the Q-output of which is fed to an AND gate 431. Additional single bit Bsi is fed to the AND gate 431, the output of which is fed to the OR gate 427.

The differences between the multi-modulus frequency divider shown in FIGS. 4 and 1 are that the former includes the OR gate 427, the D-FF 429 and the AND gate 431. The structure and function of the circuits common to both multi-modulus frequency dividers are identical.

In response to the Q output of the D-FF 421, the counter 417 selects either of two division ratios P and P+1. P+1 is a power of two $(P+1=2^k)$.

In a case of the single bit Bsi being logic "0", the output of the AND gate 431 is "0" and the OR gate 427 forwards the output of the D-FF 421 to the P/P+1 control input of the counter 417. In this case, the circuit operates in the same manner as the circuit of FIG. 1 (i.e., N-divider).

In a case of the single bit being logic "1", when the counter 419 is in the 0 state (see FIG. 3), the output of the AND gate 431 is "1" which is transferred to the P/P+1 control input of the counter via the OR gate 427. In this case, the DMC 417 is forced to count to P+1 for ogle additional state per cycle. The result is that the division ratio of the multi-modulus divider is increased by 1 (i.e., (N+1)-divider). This type of divider can be used for fractional division around a programmable integer division ratio N.

Figure 5:
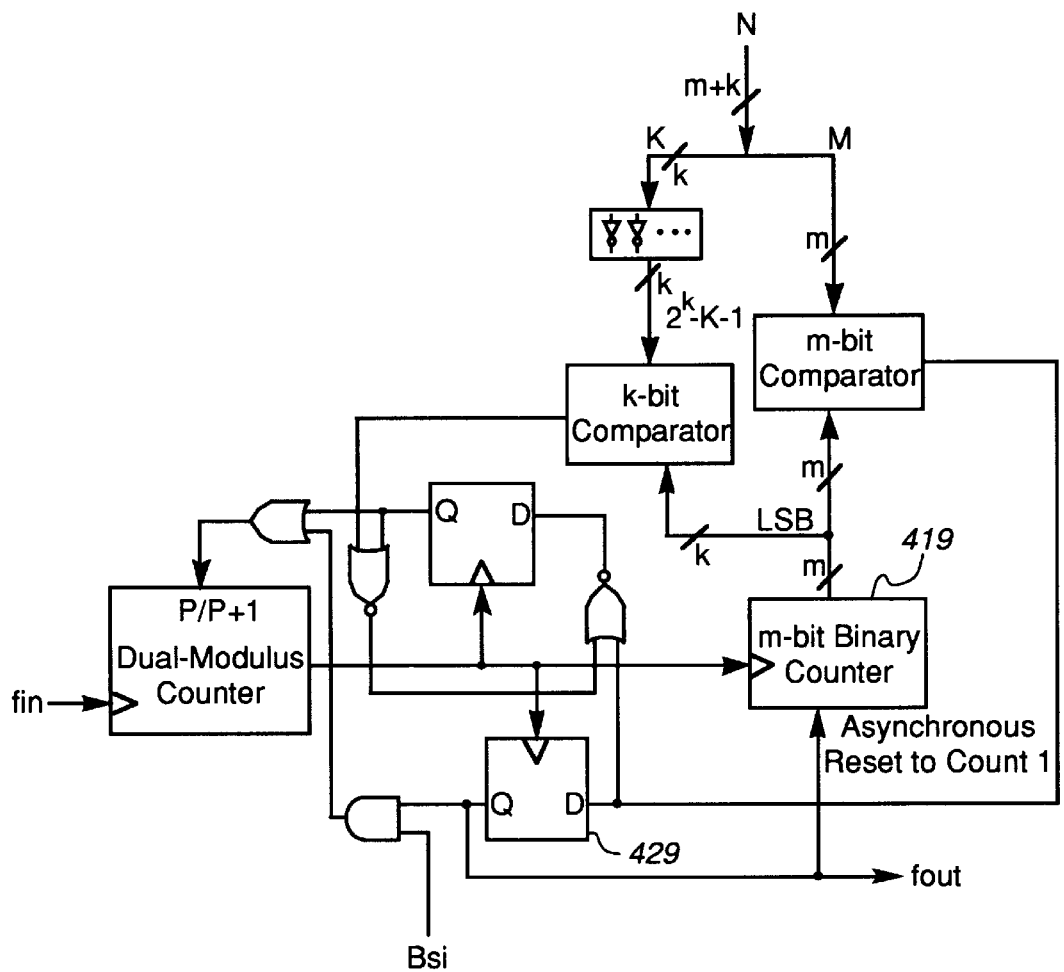
FIG. 5 is a block diagram of a multi-modulus frequency divider according to another embodiment of the present invention.

FIG. 5 is a block diagram of a multi-modulus frequency divider according to another embodiment of the present invention. The divider shown in FIG. 5 is a minor modification of the divider shown in FIG. 4. In FIG. 5, the m-bit counter has an asynchronous reset. The output of the divider is provided from the Q output of the D-FF 429. Also, the output is fed to the counter 419 to achieve a synchronous reset. The retiring function is performed by the D-FF 429. The counter 419 remains as long as the reset signal input thereto is "1", because the counter reset is asynchronous. This causes the counter 419 to divide by M+2. When the counter 419 receives a "high" reset input signal, it is reset to count 1, instead of count 0, with the result that the counter 419 divides by M+1.

Although particular embodiments of the present invention have been described in detail, it should be appreciated that numerous variations, modifications, and adaptations may be made without departing from the scope of the present invention as defined in the claims.

What is claimed is:

1. A multi-modulus frequency divider comprising:
   a dual-modulus counter responsive to an input signal and for providing an output, the dual-modulus counter dividing the frequency of the input signal by either of division ratios P and P+1, P+1 being a power of two, the output having a divided frequency;
   binary counting means responsive to the output from the daul-modulus counter, the binary counting means providing binary data representing the counting status thereof;
   data comparison means for comparing binary data representing an input division ratio to the binary data representing the counting status of the binary counting means; and
   selection means for selecting the division ratio of the dual-modulus counter in response to the comparison result of the data comparison means.

2. The multi-modulus frequency divider of claim 1, wherein the binary counting means comprises m-bit binary counter providing m-bit binary data representing the counting status.

3. The multi-modulus frequency divider of claim 2, wherein the data comparison means comprise:
   means for separating the binary data of the input division ratio into first binary data of m-bits representing a first value and second binary data of k-bits representing a second value; and
   complement means for providing complements of the second binary data.

4. The multi-modulus frequency divider of claim 3, wherein the data comparison means further comprises:
   first comparison means for comparing the m-bit binary data representing the counting status to the first binary data of m-bits representing the first value; and
   second comparison means for comparing k least significant bits of the m-bit binary data representing the counting status to the complements of the second binary data.

5. The multi-modulus frequency divider of claim 4, wherein the selection means comprises response means for determining the division ratio of the dual-modulus counter from the first and second division ratios in response to the comparison result of the data comparison means.

6. The multi-modulus frequency divider of claim 5, wherein the response means comprises a flip-flop for choosing either of the first and second division ratio.

7. The multi-modulus frequency divider of claim 3, wherein the complement means comprises a plurality of inverters.

8. The multi-modulus frequency divider of claim 4, wherein each of the first and second comparison means comprises a plurality of exclusive NOR gates.

9. The multi-modulus frequency divider of claim 8, further comprising an AND gate for providing an AND output from the outputs of the exclusive NOR gates.

10. The multi-modulus frequency divider of claim 5, wherein the response means comprises timing means for determining the timing of the selection of the division ratio for the dual-modulus counter.

11. The multi-modulus frequency divider of claim 10, wherein the timing means comprises:
    a first flip-flop clocked by the output of the dual-modulus counter; and
    first logic means for logically combining the outputs of the flip-flop and the data comparison means to generate a logic signal which determines the timing of the selection of the division ratio for the daul-modulus counter.

12. The multi-modulus frequency divider of claim 10, wherein the timing means comprises:
    second and third flip-flops clocked by the output of the daul-modulus counter; and
    second logic means for logically combining the outputs of the second and third flip-flops and the data comparison means to generate a logic signal which determines the timing of the selection of the division ratio for the dual-modulus counter.

13. The multi-modulus frequency divider of claim 12, wherein the second logic means comprises an AND gate for receiving the output of the third flip-flop and an additional bit signal.

14. The multi-modulus frequency divider of claim 13, wherein the additional bit signal comprises a single bit signal.

15. The multi-modulus frequency divider of claim 4 wherein the comparison result of the second comparison means synchronously resets the m-bit binary counter.

16. The multi-modulus frequency divider of claim 12, wherein the comparison result of the second comparison means is provided to the timing means and is provided as the output of the multi-modulus frequency divider.

17. The multi-modulus frequency divider of claim 12, wherein:
    the third flip-flop is a D type one;
    the comparison result of the second comparison means is provided to the D input of the third flip-flop, the output of which is provided as the output of the multi-modulus frequency divider and asynchronously reset the m-bit binary counter.

18. The multi-modulus frequency divider of claim 17, wherein the output of the third flip-flop asynchronously reset the in-bit binary counter to count 1.

19. The multi-modulus frequency divider of claim 2, wherein the daul-modulus counter is constructed with bipolar transistor devices and the m-bit binary counter is constructed with CMOS (complementary metal oxide semiconductor) devices.

20. The multi-modulus frequency divider of claim 19, wherein the bipolar transistor devices and the CMOS devices are implemented in a BiCMOS (bipolar-complementary metal oxide semiconductor) circuit.

* * * * *